United States Patent [19]
Fukatsu et al.

[11] Patent Number: 5,877,531
[45] Date of Patent: Mar. 2, 1999

[54] MIS TYPE SEMICONDUCTOR DEVICE AND METHOD FOR MANUFACTURING SAME

[75] Inventors: Shigemitsu Fukatsu; Ryoichi Kubokoya, both of Okazaki; Kenji Shiratori, Nukata-gun; Nobuyuki Ooya, Kariya, all of Japan

[73] Assignee: Nippondenso Co., Ltd., Kariya, Japan

[21] Appl. No.: 76,737

[22] Filed: May 13, 1998

Related U.S. Application Data

[62] Division of Ser. No. 961,086, Oct. 30, 1997, which is a continuation of Ser. No. 431,326, Apr. 28, 1995, abandoned.

[30] Foreign Application Priority Data

Apr. 28, 1994 [JP] Japan .................................. 06-91714
Mar. 23, 1995 [JP] Japan .................................. 07-64115

[51] Int. Cl.$^6$ ........................ H01L 29/76; H01L 29/94; H01L 31/062
[52] U.S. Cl. ........................ 257/344; 257/345; 257/346; 257/408
[58] Field of Search ................... 257/343, 344, 257/345, 346, 408

[56] References Cited

U.S. PATENT DOCUMENTS

| | | |
|---|---|---|
| 4,908,327 | 3/1990 | Chapman . |
| 4,924,277 | 5/1990 | Yamane et al. . |
| 4,956,311 | 9/1990 | Liou et al. . |
| 5,036,019 | 7/1991 | Yamane et al. . |
| 5,216,272 | 6/1993 | Kubokoya et al. . |
| 5,334,870 | 8/1994 | Katada et al. . |
| 5,413,945 | 5/1995 | Chien et al. . |
| 5,492,847 | 2/1996 | Kao et al. . |
| 5,532,176 | 7/1996 | Katada et al. . |

OTHER PUBLICATIONS

Wolf et al., "Silicon Processing for the VLSI Era vol. 1: Process Technology", Lattice Press, pp. 292–293, 1986.

*Primary Examiner*—Ngan V. Ngo
*Attorney, Agent, or Firm*—Pillsbury Madison & Sutro LLP

[57] ABSTRACT

A P-type impurity is doped by oblique ion implantation into N-type impurity diffusion layers formed respectively on both sides of a gate electrode of a Pch MOS transistor, thereby canceling the impurity of at least a portion of an N-type region overlapped by the gate electrode, to thereby suppress a rise in the threshold voltage of the P-channel type MIS transistor due to the N-type impurity diffusion layer and suppress fluctuations in the amount of current that can be made to flow and the current-driving capacity.

8 Claims, 17 Drawing Sheets

MIS TYPE SEMICONDUCTOR DEVICE AND METHOD FOR MANUFACTURING SAME

CROSS REFERENCE TO RELATED APPLICATION

This is a division of application Ser. No. 08/961,086 filed Oct. 30, 1997, which is a continuation of Ser. No. 08/431,326, filed Apr. 28, 1995, now abandoned.

This application is based upon and claims the benefit of priority of the prior Japanese Patent applications No. 6-91714 filed on Apr. 28, 1994 and No. 7-64115 filed on Mar. 23, 1995, the contents of which are included herein.

BACKGROUND OF THE INVENTION

1. Field of the Invention

The present invention relates to the structures of a high withstand voltage MIS transistor and a complementary transistor, and a method for manufacturing the same.

2. Related Arts

Conventionally, explaining by using a P channel MOS type transistor as shown in FIG. 1 as an example, there exists a so-called "offset/gate structure transistor" in which the drain thereof is divided into two regions, one being a high impurity concentration ($P^+$) region 7 and the other being an offset region 6 having a lower impurity concentration ($P^-$) than that of the region 7, thereby suppressing the field concentration at a gate edge portion 9 and enhancing the drain voltage-withstand characteristic.

However, the above-mentioned offset/gate-structure element incurs the problem that while in operation, the offset region 6 acts as a high resistance component, thereby decreasing current-driving capacity.

In order to solve the above-mentioned problem, Published Unexamined Japanese Patent Application No. H42-12465 discloses a so-called duplex-offset structure transistor which is constructed as follows. As shown in FIG. 2, the offset region 6 and the drain region 7 of the conventional offset/gate structure transistor are surrounded by a diffusion layer region 10 of the same conductivity type as that of the substrate so as to enable the formation of an offset region 6 by a high impurity concentration diffusion layer. This offset region 6 is thereby made to have a lower resistance, which results in improvement of the current-driving capacity.

Further, in a CMOS type transistor, as the miniaturization thereof proceeds, the short-channel effect or hot-carrier effect thereof becomes large, and therefore consideration needs to be given to this problem. Published Unexamined Japanese Patent Application No. S62-217666 discloses as one countermeasure thereagainst a method for manufacturing a MOS type semiconductor device which involves the step of surrounding the source/drain layers of a P-type channel MOS transistor and N-type channel MOS transistor with N-type impurity layers to thereby simultaneously decrease the above-mentioned effects.

Meanwhile, in recent years, there has been a tendency to decrease the level of the drive voltage in view of the demand for power consumption reduction. This means that there is an attempt to drive transistors which have hitherto been made to operate, usually, with a drain voltage of 5V with a drain voltage of, for example, 3V or 2.5V.

However, it has been discovered that in cases where a MOS transistor such as that disclosed in the above publication is driven with the above-mentioned low voltage, the threshold voltage level largely varies. To explain by using the FIG. 2 shown P channel type offset/gate structure transistor as an example, as illustrated in FIG. 5, a threshold voltage Vth level difference of approximately 1V is produced between when the drain voltage $V_D=-5V$ and when the drain voltage $V_D=-0.1V$. When the threshold voltage level varies as mentioned above, since the drain current $I_D \propto (V_G-Vth)$ where $V_G$ represents the gate voltage, the amount of the current which can be made to flow with the driving voltage largely varies depending upon variations in the threshold voltage level, or the transconductance thereof varies, with the result that the current-driving capacity varies. This raises the problem of limitation of the degree of freedom of circuit-designs.

SUMMARY OF THE INVENTION

Accordingly, an object of the present invention is to provide a transistor structure capable of suppressing variations in the amount of the current that can be made to flow when the -drive voltage varies and of suppressing variations in the current-driving capacity when such variations occur in the drive voltage, and a method for manufacturing the same.

Under the above-mentioned circumstances, the present inventors have studied these problems and discovered that the reason why the threshold voltage rises due to the drive voltage is attributable to the existence of the double offset region 10. Namely, the impurity concentration of a region for forming an inversion layer that is indispensable to the operation of the MOS transistor increases, so that the voltage rises until the inversion layer is formed.

This is also the case concerning the structure disclosed in the above-mentioned Published Unexamined Japanese Patent Application No. S62-217666. Namely, since the hot-carrier effect of the N channel transistor increases as the length of the gate electrode decreases, when attempting to enhance the field-weakening action in order to suppress the hot-carrier effect, it is necessary, for example, to enlarge the inclination angle for ion implantation and thereby form a low-concentration N-type impurity layer at a position which is further inside and below the gate electrode. This is followed by the inconvenience that, also in the P channel transistor, a low-concentration N-type impurity layer is formed at a position which is further inside and below the gate electrode. As a result, the problem mentioned above arises.

Accordingly, the semiconductor device according to the present invention provides a MIS type semiconductor device which comprises a MIS structure transistor including, in a first-conductivity type first semiconductor region formed in and at the surface of a semiconductor substrate, a source region and a drain region each of which has a second-conductivity type impurity concentration as specified, the conduction of the MIS structure transistor being controlled by a gate electrode disposed on the surface of the semiconductor substrate, the MIS type semiconductor device being characterized by further comprising a first-conductivity type second semiconductor region that surrounds the drain region in the first semiconductor region and has an impurity concentration higher than that of the first semiconductor region, wherein an inversion layer forming region, which is a surface region of the second semiconductor region located under the gate electrode, has an impurity concentration made to be substantially equal to the impurity concentration of the first semiconductor region.

Further, the impurity concentration profile of the second semiconductor region located under the gate electrode and in the vicinity of the surface thereof preferably has, in the vicinity of the surface where the inversion layer is formed, an impurity concentration which is substantially equal to the impurity concentration of the first semiconductor region in the vicinity of the surface of the semiconductor substrate.

Further, a second-conductivity type offset region having an impurity concentration lower than that of the drain region may be disposed between the gate-electrode edge portion and the drain region, so as to alleviate the field concentration at a portion between the gate electrode edge portion and the drain region. In this case, the second semiconductor region is preferably formed with a wider area and larger diffusion depth than the area and diffusion depth of the offset region so as to surround the offset region.

Further, the manufacturing method according to the present invention is characterized by comprising: a first step of forming a gate electrode on a first-conductivity type first semiconductor region formed in a specified region of a semiconductor substrate via an insulator film; a second step of forming a first-conductivity type second semiconductor region having an impurity concentration higher than the impurity concentration of the first semiconductor region, on a basis of self-alignment relative to the gate electrode, by performing ion implantation of a first-conductivity type impurity at an angle inclined with respect to the semiconductor substrate and using the gate electrode as a mask; a third step of performing ion implantation of a second-conductivity type impurity using the gate electrode as a mask so that the impurity concentration of a region of the second semiconductor region located under the gate electrode and in the vicinity of the surface of the semiconductor substrate is substantially equal to the impurity concentration of the first semiconductor region in the vicinity of the surface thereof; and a fourth step of forming a second-conductivity type third semiconductor region by performing ion implantation of a second-conductivity type impurity in a direction substantially perpendicular to the semiconductor substrate using the gate electrode as a mask.

Note that the ion implantation performed in the third step is preferably performed at the same ion implantation angle as that at which ion implantation is performed on the second semiconductor region.

Further, the present invention can be applied to a complementary MIS semiconductor device. The manufacturing method in this case preferably comprises the following manufacturing steps: the step of forming a first-conductivity type first semiconductor element region and a second-conductivity type second semiconductor element region in specified regions of a semiconductor substrate; the step of forming a first gate electrode and a second gate electrode respectively on the first and the second semiconductor element regions via insulator films; the step of performing ion implantation of a first-conductivity type impurity at an angular direction inclined with respect to the semiconductor substrate using the first and the second gate electrodes as masks and of forming a first-conductivity type first semiconductor region and a first-conductivity type second semiconductor region in the first and the second semiconductor element regions at least one side each of the first and the second gate electrodes; the step of selectively performing compensatory ion implantation of a second-conductivity type impurity in the first-conductivity type first semiconductor element region using the first gate electrode as a mask so that the impurity concentration of the surface region of the first semiconductor region which the gate electrode overlaps approaches the impurity concentration of the first semiconductor element region in the vicinity of the surface region thereof; the step of performing ion implantation of the second-conductivity type impurity using the first electrode as a mask and thereby forming a second-conductivity type third semiconductor region in the first semiconductor element region; and the step of performing ion implantation of a first-conductivity type impurity using the second electrode as a mask and thereby forming a first-conductivity type fourth semiconductor region.

Note that the step of forming the third semiconductor region may include the first sub-step of forming a low-concentration portion of the third semiconductor region by using the first gate electrode as a mask, and the second sub-step of forming a high-concentration portion of the third semiconductor region at a position adjacent to the low-concentration portion thereof. Further, the step of performing compensatory ion implantation of the second-conductivity type impurity with respect to the first semiconductor region is preferably performed at the same ion implantation angle as that at which the first semiconductor region is formed.

According to the semiconductor device of the present invention, in a region having the same conductivity type as that of the first semiconductor region formed in the semiconductor substrate, located under the gate electrode and in the second semiconductor region having an impurity concentration higher than that of the first semiconductor region and corresponding to an inversion layer formation region in the surface region of the semiconductor substrate, the impurity concentration therein is made to be approximately equal to the impurity concentration of the first semiconductor region, therefore making it possible to suppress a rise in the threshold value voltage. As a consequence, it is possible to provide a MIS type semiconductor device which enables suppression of fluctuations in the current quantity or fluctuations in the current-driving capacity even when the drive voltage is changed and which therefore can prevent a reduction in the degree of freedom of circuit design. This is particularly effective in a high-voltage semiconductor device which has a drain region made to have a low impurity concentration for alleviating the field concentration.

Further, a MIS type semiconductor device having the above-mentioned effects can be essentially provided by adding only the step of performing ion implantation of the second-conductivity type impurity with respect to the surface region of the second semiconductor region located under the gate electrode. This brings about the advantage that it is possible to form, without using complicated steps, a MIS type semiconductor device which can suppress the effect of the second semiconductor region upon the element characteristics as the necessity arises with the miniaturization of the MIS type semiconductor device. Note that if the compensatory ion implantation of the impurity concentration in the surface region of the semiconductor region is performed at substantially the same ion implantation angle as the oblique ion-implantation angle at which the second semiconductor region is formed, an impurity-concentration compensating structure for suppressing rises in the threshold value voltage can be reliably formed.

Furthermore, according to the manufacturing method for manufacturing a complementary MIS type semiconductor device to which the present invention is applied, it is possible to manufacture a complementary MIS type semiconductor device which contains a MIS type semiconductor device which can suppress short-channel and hot-carrier effects resulting from the miniaturization of the complementary MIS type semiconductor device and can maintain the current-driving capacity at a high level.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Embodiments of the present invention will now be described with reference to the drawings.

Figure 1:
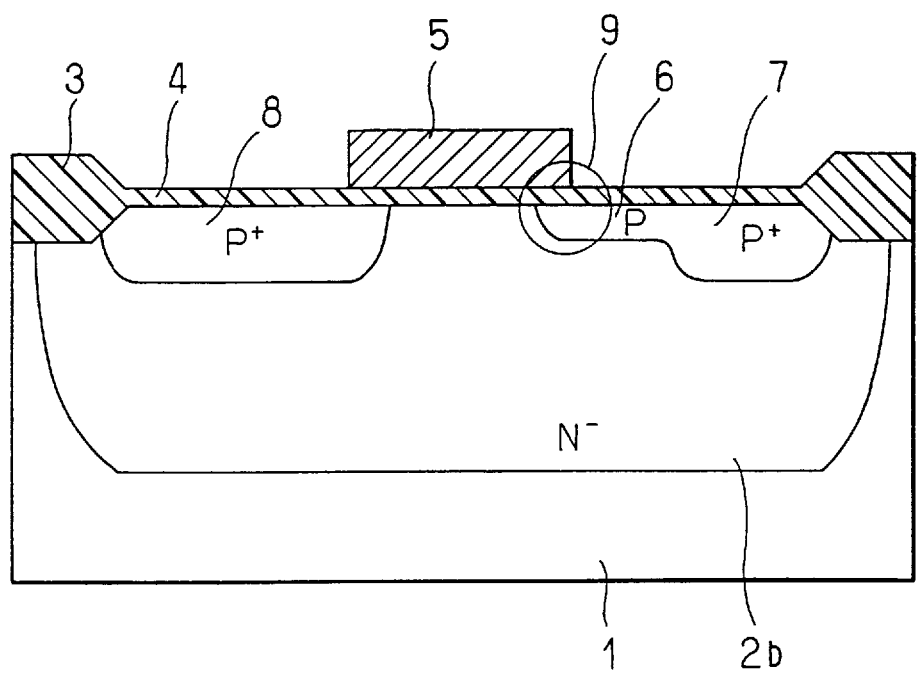
FIG. 1 is a sectional view illustrating an offset/gate structure transistor according to a conventional manufacturing method.
Figure 2:
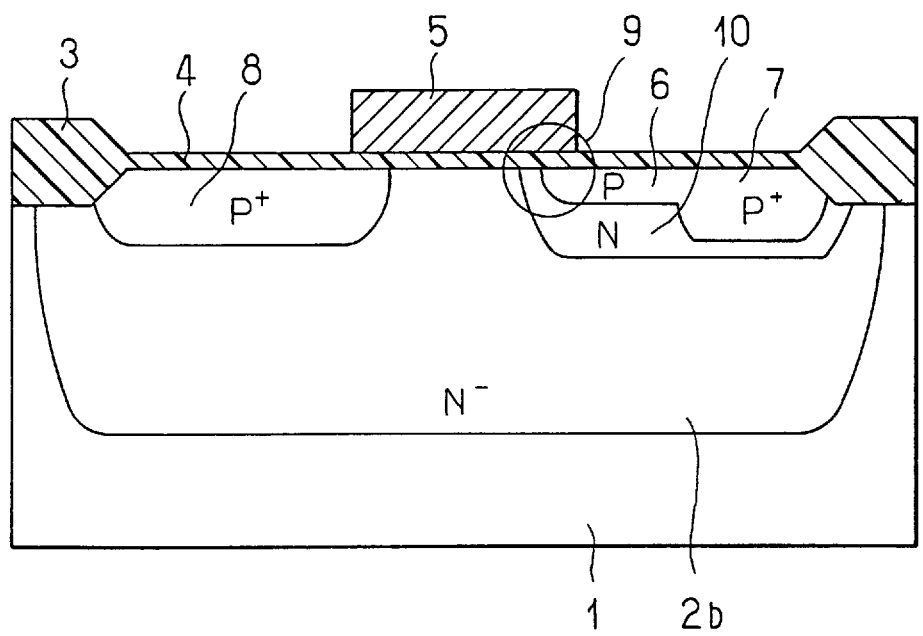
FIG. 2 is a sectional view illustrating an offset/gate structure transistor according to a conventional improved manufacturing method.
Figure 3:
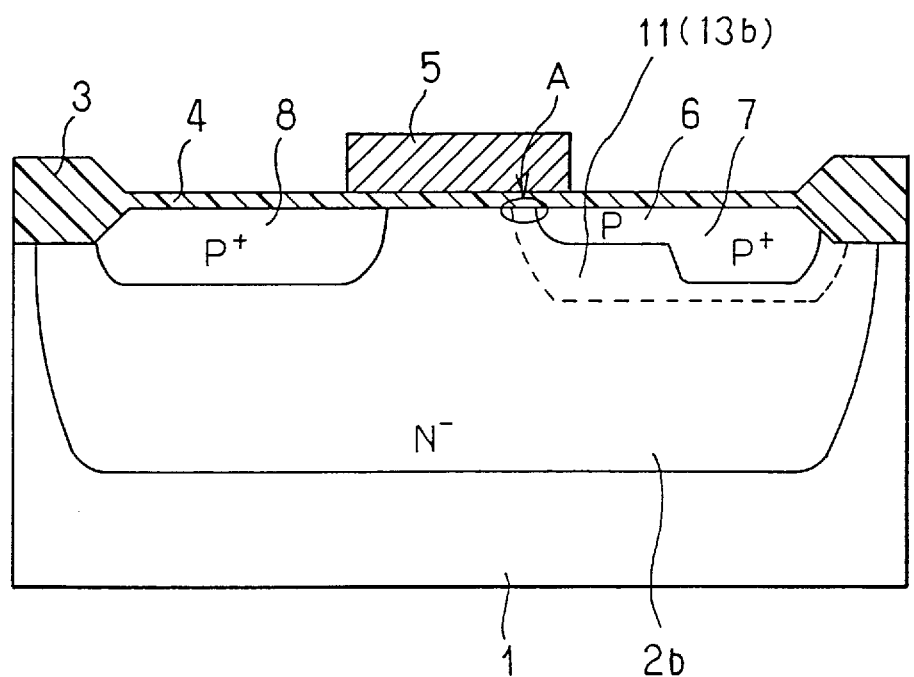
FIG. 3 is a sectional view illustrating an offset/gate structure transistor according to a manufacturing method of the present invention.

FIG. 3 is a sectional view illustrating a high withstand voltage P-type channel MOS transistor which is an example of a MIS type semiconductor device manufactured using the method of the present invention. FIGS. 7 through 13 are step views illustrating an embodiment in which the manufacturing method of the present invention is applied to a manufacturing process for a CMOS transistor with a high withstand voltage P-type channel MOS transistor, which is a type of complementary MIS transistor. Note that in the following embodiments explanation will be given with the first conductivity type and the second conductivity type being referred to respectively as N-type and P-type.

The high withstand voltage P-type channel MOS transistor which is an embodiment of the present invention comprises, as illustrated in FIG. 3, a low-concentration impurity region ($N^-$ well region) 2b formed in a semiconductor substrate 1, a field oxide film 3, a gate oxide film 4 and a gate electrode 5 formed thereon, a source region 8 consisting of a high-concentration impurity diffusion layer, and a drain region 7 and offset region 6. Further, a reverse conductivity type impurity, i.e. reverse to the conductivity type of the well region 2b, is introduced into an $N^-$ impurity region 13b having the same conductivity type as that of the $N^-$ well region 2b and so formed as to have a high impurity concentration, so that the N-type impurity concentration of a substrate-surface region located under the gate electrode and indicated by the symbol A in the figure is substantially equal to the impurity concentration of the surface region of the $N^-$ well region 2b. Note that in the following descriptions the $N^-$ impurity region 13b into which the reverse conductivity type impurity has been introduced is designated $N^-$ impurity region 11.

Figure 4A:
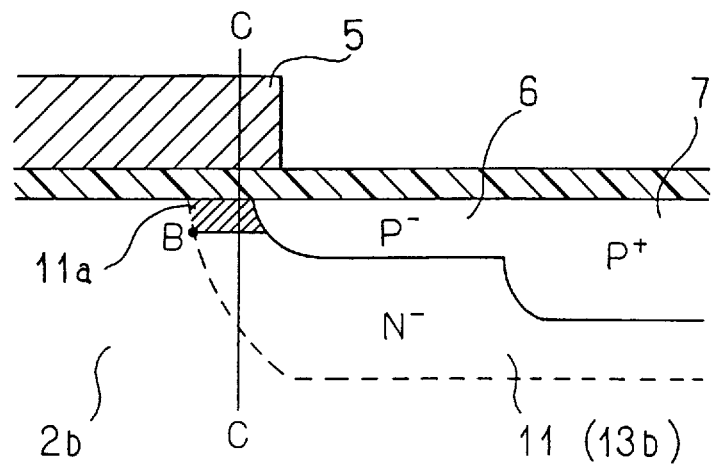
FIG. 4A is an enlarged view of FIG. 3

The state of the above will be explained below using FIGS. 4A and 4B. FIG. 4A is an enlarged view illustrating the region indicated by the symbol A in FIG. 3 and surrounding area. As illustrated in FIG. 4A, in the region 11a that constitutes a cancellation region under the gate electrode 5, the impurity concentration thereof is made to be equal to the impurity concentration of the surface region in the $N^-$ by introduction thereinto of the reverse conductivity type impurity.

Figure 4B:
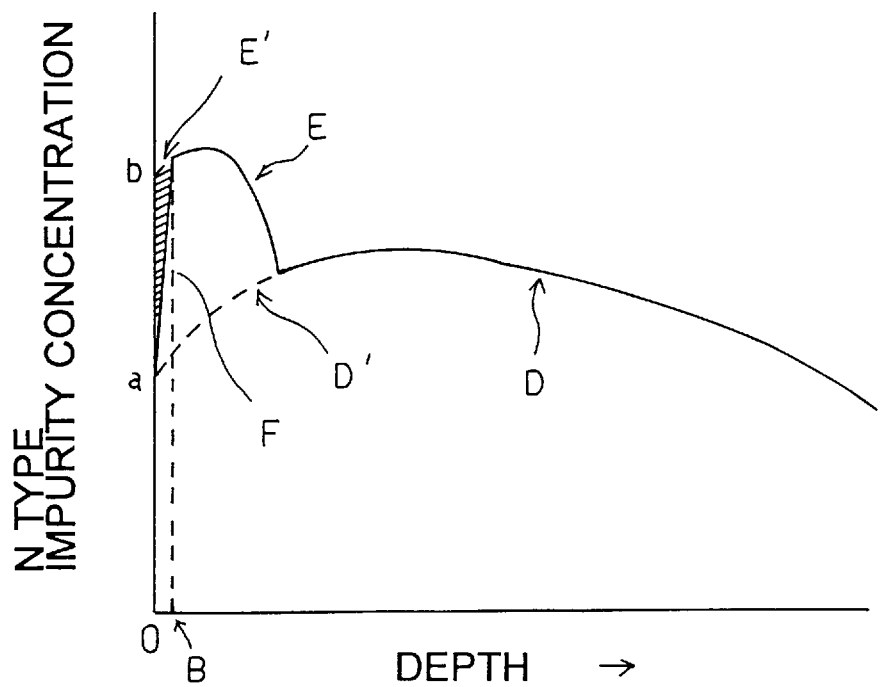
FIG. 4B is a graph illustrating the impurity concentration profile at a section C—C of FIG. 4A.

Further, FIG. 4B illustrates a N-type impurity concentration profile at a section C—C viewed vertically from the surface of the semiconductor substrate. The ordinate represents the N-type impurity concentration, while the abscissa represents the depth of the substrate. Further, the point 0 represents the surface of the substrate, while the point B represents the depth of a boundary region between the cancellation region 11a indicated in FIG. 4A and the $N^-$ impurity region 11.

In FIG. 4B, a solid line D represents the concentration profile of the $N^-$ well region 2b, a solid line E represents the concentration profile of the $N^-$ impurity region 11, and a solid line F represents the concentration profile of the cancellation region 11a. Further, a dotted line D' represents the impurity concentration of a portion of the $N^-$ well region 2b in the vicinity of the substrate surface before formation of the $N^-$ impurity region 11 (13b), namely the impurity concentration of the under-gate electrode 5 portion of the $N^-$ well region 2b where the channel is formed. A dotted line E' represents the impurity concentration of the portion of the well region 2b after formation of the $N^-$ impurity region 11 (13b) and before formation of the cancellation region 11a, which portion is in the vicinity of the substrate surface.

In other words, conventionally, by forming the $N^-$ impurity region 13b, the concentration in the vicinity of the substrate surface rises from the concentration indicated by the solid line D' (which corresponds to the concentration at the point a in the substrate surface) up to the concentration indicated by the solid line E (which corresponds to the concentration at the point b in the substrate surface), with the result that when the drive voltage is changed, the threshold value voltage fluctuates, or the current-driving capacity fluctuates. In this view, in the present invention, by performing ion implantation for forming the cancellation region 11a, the N-type impurity inside the hatched portion between the dotted line E' and the solid line F is canceled out by a P-type impurity, thereby approximating the relevant N-type impurity concentration in the vicinity of the substrate surface from the point-b concentration to the point-a concentration, namely to the surface portion impurity concentration of the $N^-$ well region 2b of the substrate.

Note here that FIGS. 4A and 4B have been simplified for ease of understanding and convenience of explanation and that, therefore, they differ from actual sectional views and concentration profiles.

Figure 7:
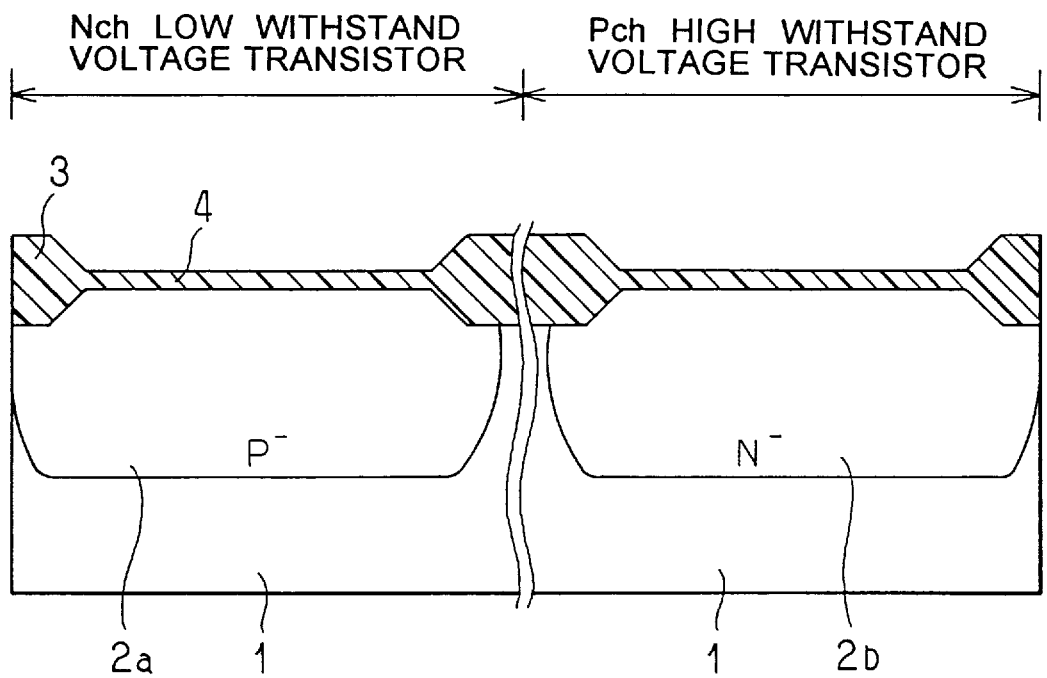
FIGS. 7 to 13 are sectional views of steps for explaining the manufacturing method according to an embodiment of the present invention.

Next, an embodiment of the manufacturing method according to the present invention will be explained with reference to the drawings, illustrating a case wherein the manufacturing method according to the present invention is applied to the process steps for manufacturing a complementary MOS transistor. In FIG. 7, a complementary MOS transistor is illustrated in which an N-type channel MOS transistor having ordinary source/drain withstand voltage characteristics (hereinafter referred to as "Nch low withstand voltage transistor") and an offset/gate structure P-type channel MOS transistor (hereinafter referred to as "Pch high withstand voltage transistor") are formed.

As illustrated in FIG. 7, using a known technique, a P$^-$ well region 2a, an N$^-$ well region 2b, a field oxide film 3, and a gate oxide film 4 are formed in a silicon substrate 1 having a relatively high resistance.

Figure 8:
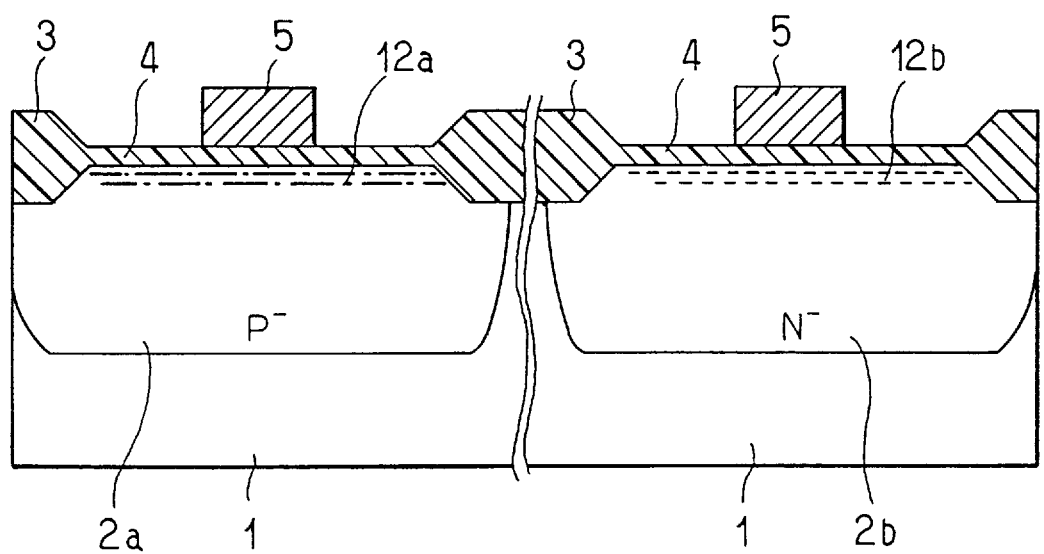

As illustrated in FIG. 8, in order to set the desired threshold value for each of the transistors to be formed, threshold-value adjusting impurities 12a, 12b (hereinafter not illustrated) are ion implanted where necessary. And a poly-silicon layer that becomes a gate electrode is laminated on the gate oxide film 4 using a CVD method to thereby form the gate electrode 5 by means of an ordinary photo-etching technique.

Figure 9:
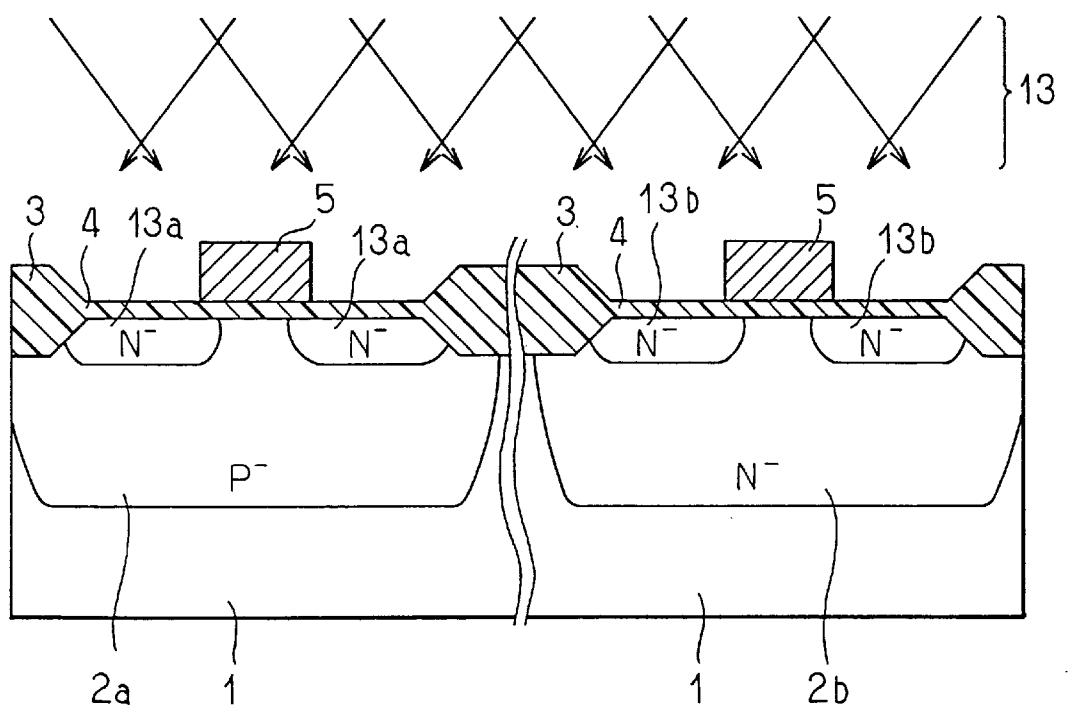

Subsequently, as illustrated in FIG. 9, after formation of a thin oxide film (not illustrated) on each of the gate electrodes 5, ion implantation 13 of an N-type impurity is performed simultaneously with respect to each of the Nch low withstand voltage transistor formation region and Pch high withstand voltage transistor formation region to thereby form N$^-$ impurity regions 13a/13a and 13b/13b on both sides of the gate electrodes 5. Note that while usual ion implantation in the ion implantation step is performed at an inclination angle defined 0° to 7° with respect to a line that is normal to the wafer, in this embodiment ion implantation 13 of the N-type impurity has been performed from an oblique direction inclined 60° with respect to the normal line of the wafer. The ion implantation was performed under the conditions that the impurity was phosphorus, the acceleration was 90 KeV, and the dose was approximately 6×10$^{13}$, whereupon heat treatment was performed at 1,000° C. for ten minutes.

Figure 10:
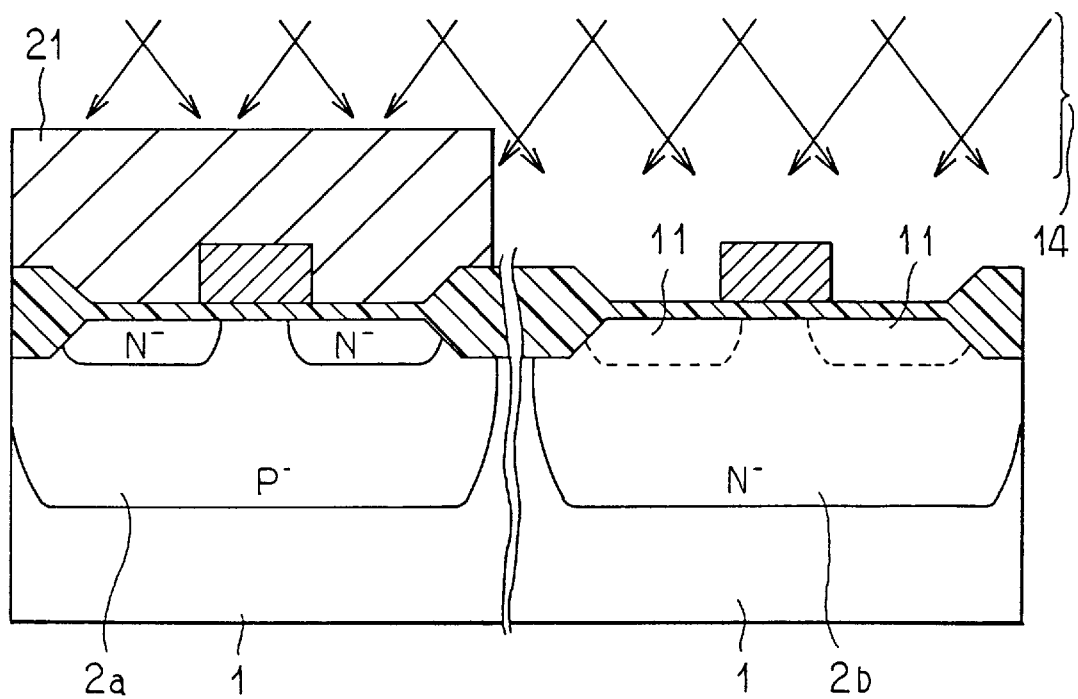

Next, as illustrated in FIG. 10, the Nch low withstand voltage transistor formation region is masked by, for example, a photo-resist 21, whereupon ion implantation 14 of a P-type impurity is performed with respect to only the Pch high withstand voltage transistor formation region. The ion implantation 14 is performed so as to substantially cancel the N$^-$ impurity portion located at least under the gate electrode 5 which is among the N$^-$ impurity regions 13a, 13b illustrated in FIG. 9. In this embodiment, boron has been doped as an impurity at the same implantation angle, and in the same doses, as in the case of the ion implantation 13 of the N-type impurity and with an acceleration voltage so set that the range of ions may be substantially equal to that in the case of the ion implantation 13. Namely, if the ion implantation were performed, with the impurity diffusion rate taken into consideration, under the conditions that the impurity concentration of the N$^-$ impurity region 11 (13b) located under the gate electrode and at the surface of the semiconductor substrate may eventually become substantially equal to the impurity concentration of the N$^-$ well region 2b, it would sufficiently serve this purpose. In this embodiment, as one of these conditions, ion implantation was performed at an implantation angle of 60°, in approximately 6×10$^{13}$ doses, and at an acceleration voltage of 50 KeV. Note that the N$^-$ impurity region 13b after introduction of the reverse conductivity type impurity is designated an N$^-$ impurity region 11.

By performing the above-mentioned ion implantation 14, adverse effects upon the threshold value Vth or current-driving capacity of the Pch high withstand voltage transistor are suppressed. Specifically, the threshold value Vth is determined by the threshold-value adjusting impurity layer 12b or, otherwise, by the surface concentration of the N$^-$ well region 2b and, in this way, control of the threshold value becomes easy.

Figure 11:
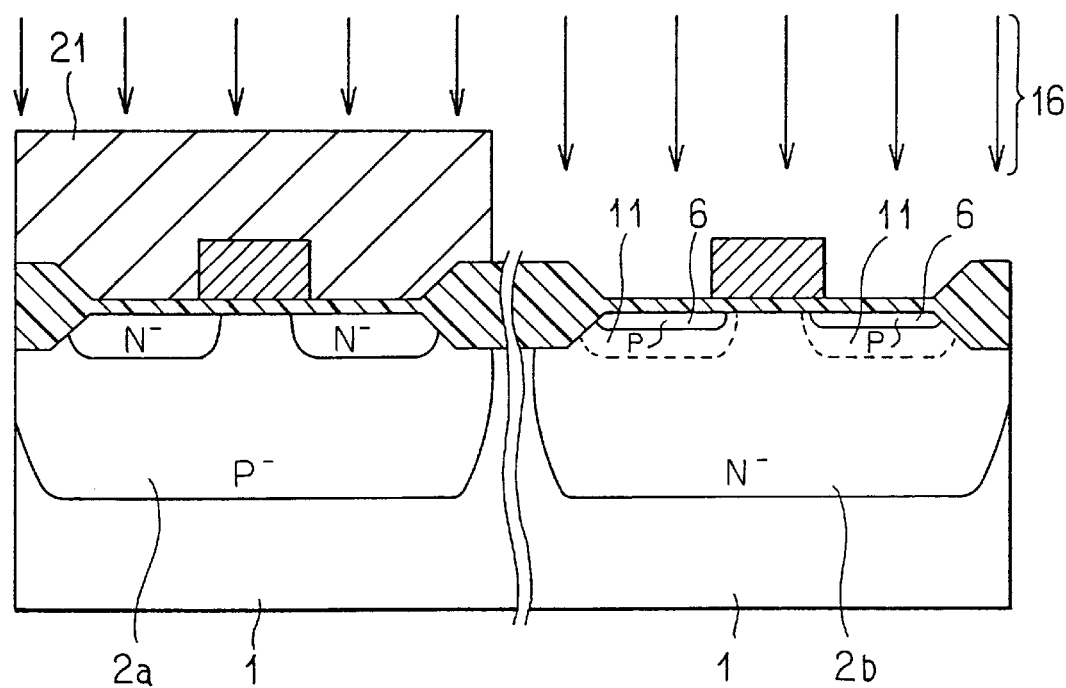

Thereafter, as illustrated in FIG. 11, using the conventional method, a P-type impurity is doped by ion implantation (16) to thereby form a diffusion layer 6 that becomes an offset region. In this embodiment, as the implanting conditions at this time, the implantation angle was 7°, the acceleration voltage was 30 KeV, and the dose was 4×10$^{13}$. The concentration of the offset region 6 is determined by the ion implantations 14 and 16 of the P-type impurity as mentioned above.

Figure 12:
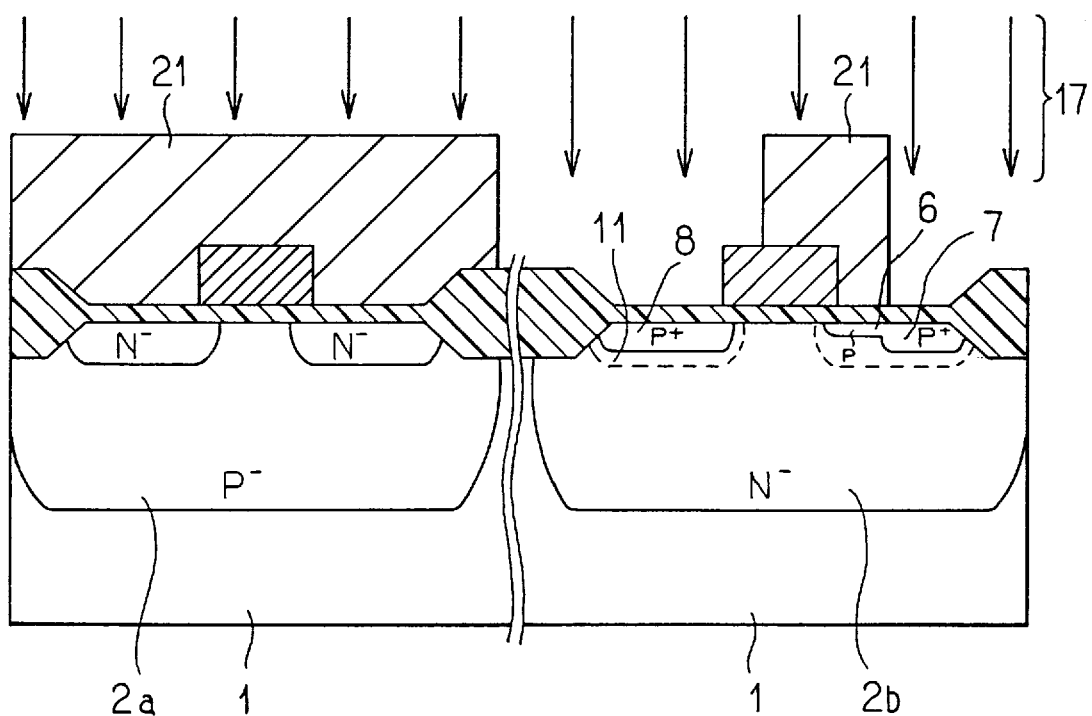
Figure 13:
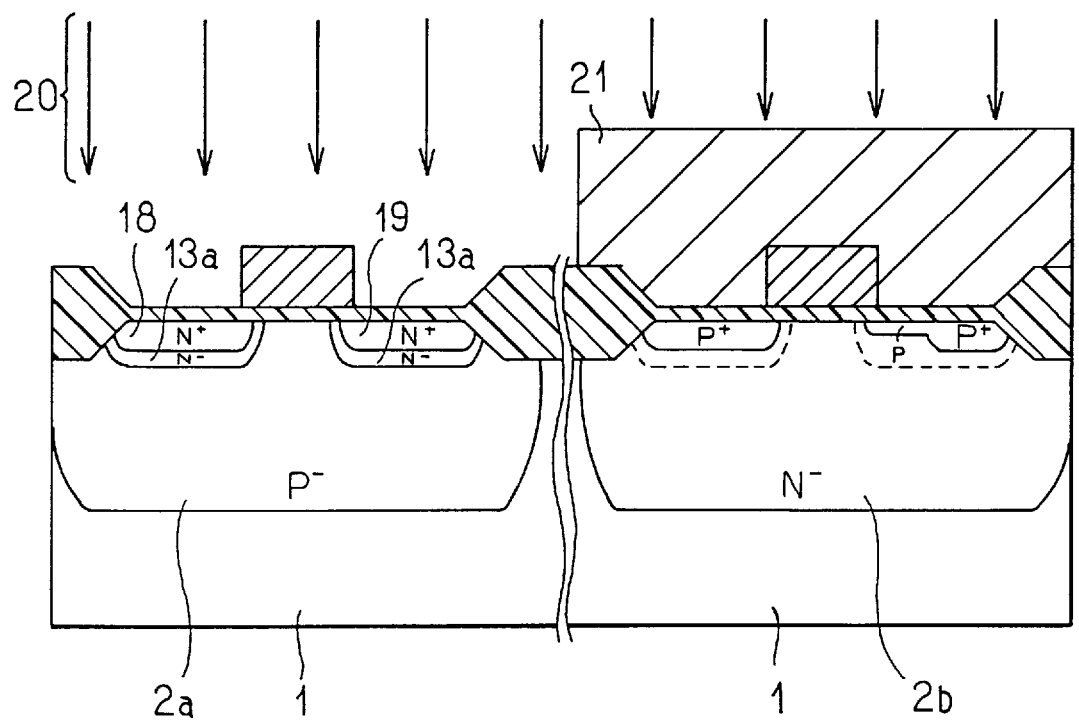
Figure 14:
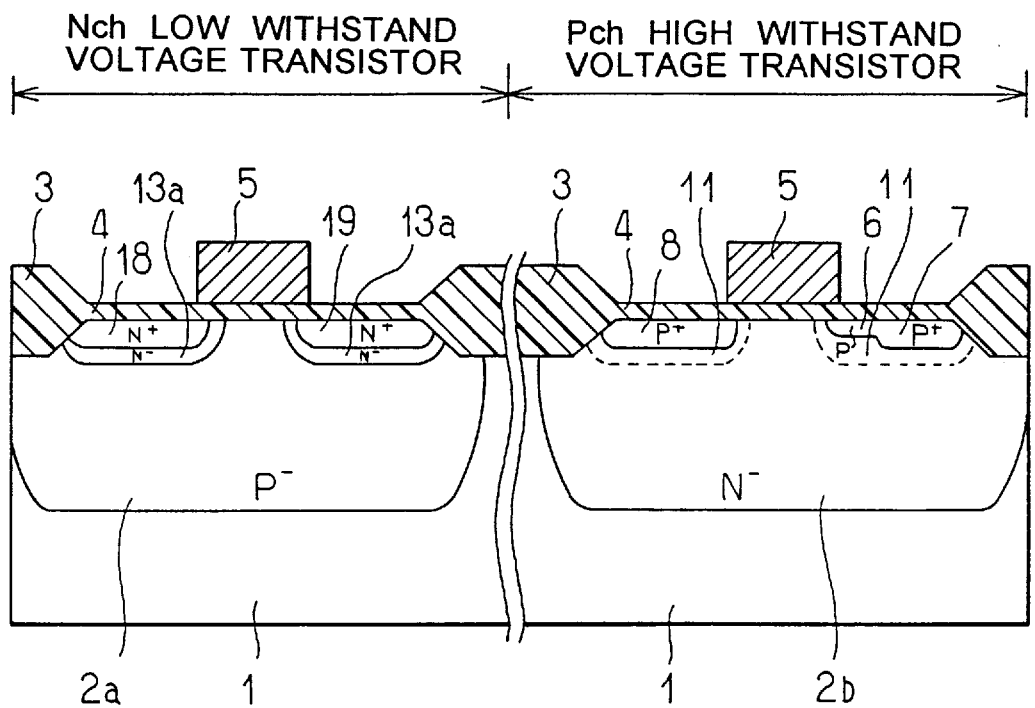
FIG. 14 is a sectional view illustrating an example of a complementary type transistor formed using the manufacturing method of the present invention.

Subsequently, as illustrated in FIGS. 12 and 13, P$^+$ source/drain layers 8/7 and N$^+$ source/drain layers 18/19 are respectively formed with respect to the Pch high withstand voltage transistor region and the Nch low withstand voltage transistor region and, after the performance of, for example, an electrode wiring step (not illustrated), a complementary MOS transistor as illustrated in FIG. 14 is manufactured.

Figure 5:
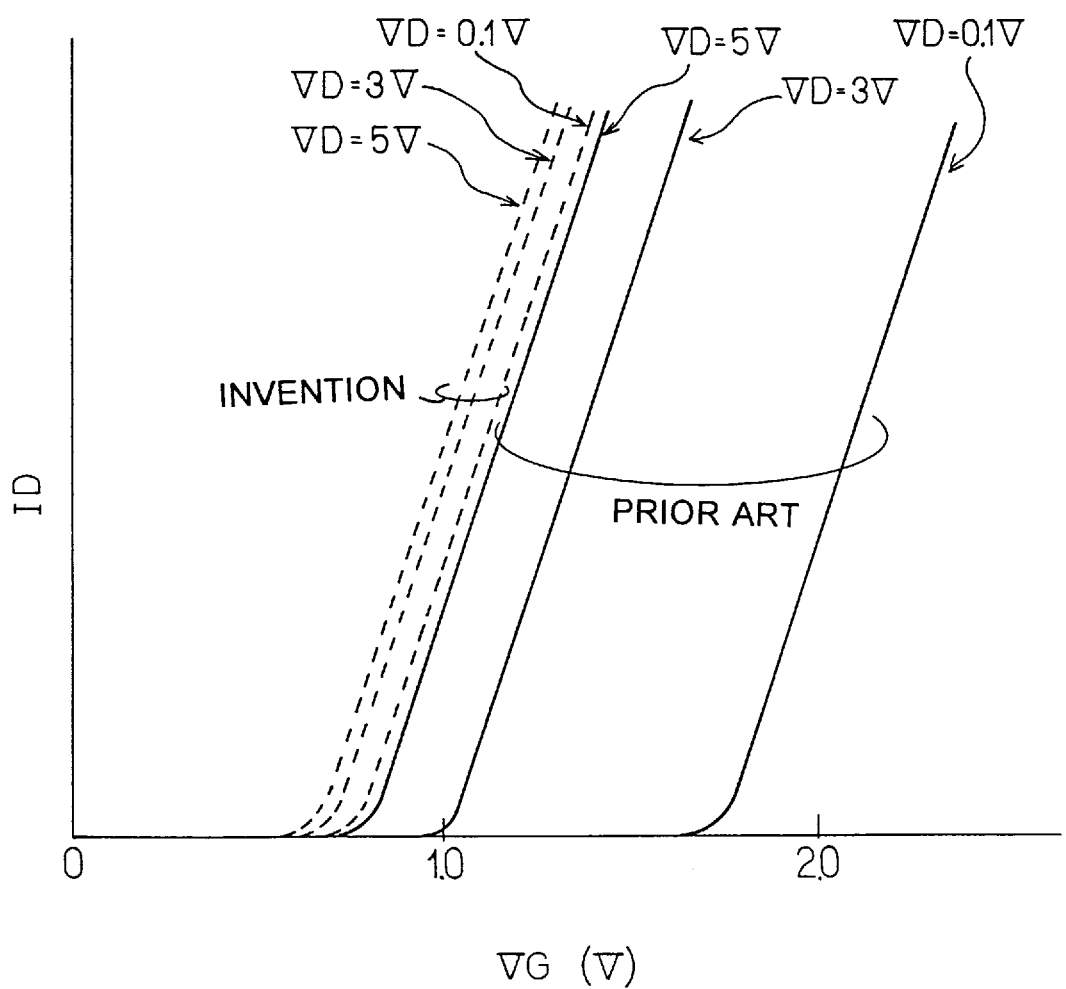
FIG. 5 is a characteristic comparison diagram illustrating the characteristics of an offset/gate structure transistor according to the manufacturing method of the present invention and those of an offset/gate structure transistor formed using the conventional manufacturing method.

The characteristics of the thus-manufactured Pch high withstand voltage transistor are illustrated in FIG. 5.

Note that the broken lines in FIG. 5 represent the characteristics of the transistor manufactured using the manufacturing method of the present invention while the solid lines represent the characteristics of a transistor manufactured using the conventional manufacturing method.

As can be seen from FIG. 5, the threshold voltage of the transistor manufactured using the conventional method has a level difference of approximately 0.8 V between when the drain voltage Vd=−0.1V and when the drain voltage Vd=−5V, whereas in the case of the method of the present invention it is possible to reduce this level difference. Further, although understanding in the figure is difficult, there is also the effect that fluctuations in the current-driving capacity (transconductance gm) due to variations in the drive voltage can be suppressed.

Accordingly, as regards the Pch high withstand voltage transistor having the N$^-$ impurity regions 11 each of a higher concentration than that of the N$^-$ well region 2b around the source and drain regions 8, 7, the diffusion layer 6 that becomes the offset region being formed in each of the impurity regions 11, since the P-type impurity that is a reverse conductivity type impurity is introduced into each of the surface regions of the N$^-$ impurity region 11 located under the gate electrode 5 to thereby form the cancellation regions 11a, thereby approximating the impurity concentration of the N$^-$ well region 2b, it is possible to suppress fluctuation in the threshold value even when the drive voltage has changed.

As a consequence, not only fluctuation in the amount of the current that can be made to flow but also fluctuation in the current-driving capacity (transconductance gm) can be suppressed even when the drive voltage changes. This makes it possible to provide the Pch high withstand voltage transistor capable of preventing a reduction in the degree of freedom in circuit-design.

Further, according to the above-mentioned manufacturing method, it is possible to manufacture a complementary MOS transistor which includes a high-voltage MOS transistor enabling not only reduction in the short-channel effect and hot-carrier effect resulting from the miniaturization of the complementary MOS transistor but also the suppression of fluctuations in the threshold value and current-driving capacity.

Further, according to the above-mentioned manufacturing method, since the patterns of the resist masks 21 used when performing ion implantations 14 and 16 are the same, the ion implantation 14 may be performed after the formation of the resist mask 21 and before performing the ion implantation 16. Namely, by merely adding the ion implantation step 14 to the conventional process, it is possible to provide a MOS transistor enabling suppression of fluctuations in the current quantity or the current-driving capacity.

Note that the cancellation region 11a needs to be formed at least up to the depth of the region where the inversion layer is formed. However, if the amount of ion implantation of the P-type impurity for forming the cancellation region 11a is too excessive, this cancellation region 11a would inconveniently become a region of high P-type impurity concentration, so that the withstand voltage characteristic is determined at a boundary line in which the amount of ion implantation of the P-type impurity exceeds a specified value. Therefore, the amount of ion implantation involves an upper limit.

Figure 6:
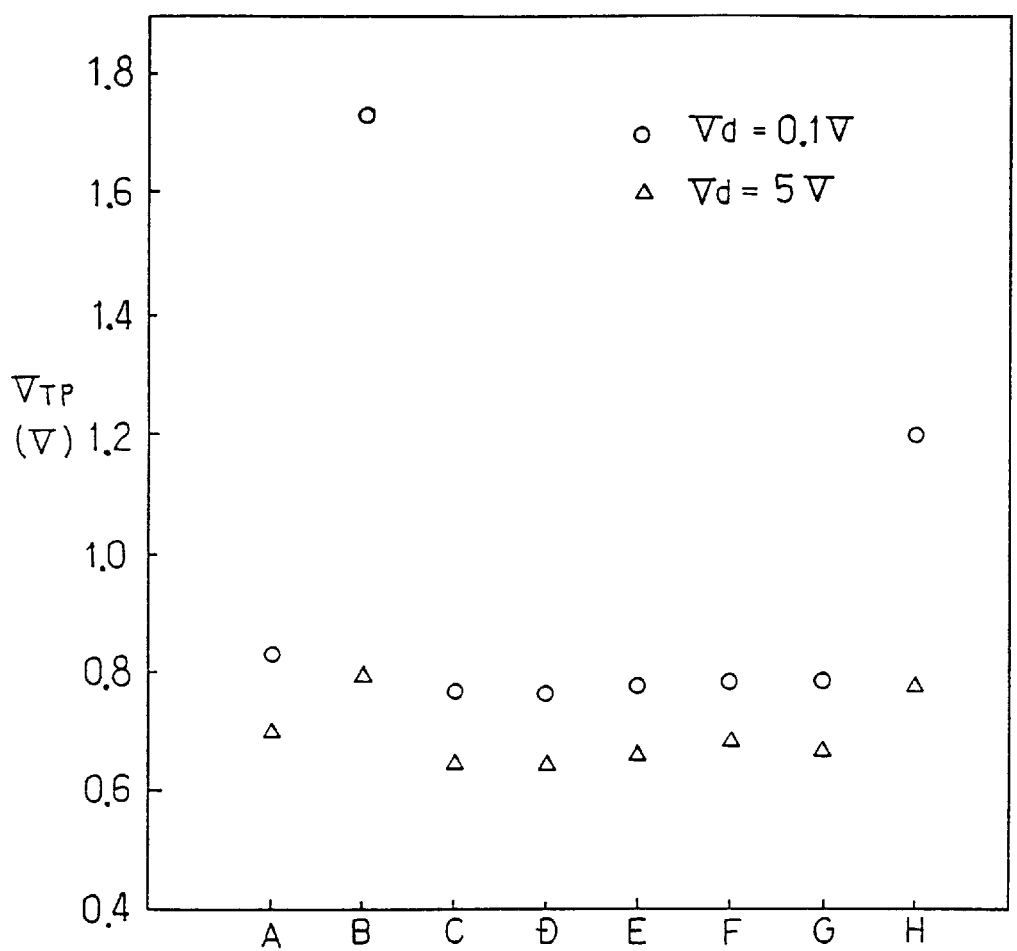
FIG. 6 is a characteristic comparison diagram prepared using different ion-implantation steps.

The inventors of the present invention have examined fluctuations in the threshold value $V_{TP}$ occurring when the drain voltage is changed between Vd=0.1V and Vd=5V when the ion implantation angle and dose (I,I,13) of the N-type impurity for forming the N⁻ impurity region 13b, the ion implantation angle and dose (I,I,14) of the P-type impurity for forming the cancellation region 11a, and the ion implantation angle and dose (I,I,16) for forming the source and drain layers 8, 7 have each been changed as shown in Table 1 below, the results thereof being shown in FIG. 6. The mark ○ in the figure represents a data item obtained when Vd=0.1V and the mark △ represents a data item obtained when Vd=5V.

The data items shown in FIG. 6 are data which have been obtained using eight sample wafers A through H and taking measurements at only one point on each wafer.

TABLE 1

|  | A | B | C | D | E | F | G | H |
|---|---|---|---|---|---|---|---|---|
| I, I 13 angle | 7 | 60 | 60 | 60 | 60 | 45 | 60 | 60 |
| (DEG) dose | 1.5 | 3 | 3 | 3 | 3 | 3 | 5 | 3 |
| I, I 14 angle | — | — | 60 | 60 | 60 | 45 | 60 | — |
| (DEG) dose | — | — | 3 | 3 | 3 | 3 | 5 | — |
| I, I 16 angle | 7 | 7 | 7 | 7 | 7 | 7 | 7 | 7 |
| (DEG) dose | 5.5 | 5.5 | 2.5 | 4.0 | 6.0 | 4.0 | 2.5 | 9 | dose: × 10¹³ — represented as $\times 10^{13}$

As can be seen from FIG. 6, in sample wafers B and H, when the drain voltage changes, the threshold value also significantly changes.

The sample wafer B is a sample in which the cancellation region 11a was not formed after the formation of the N⁻ impurity region 13b, and this sample corresponds to one manufactured using the conventional method. Further, the sample wafer H is also a sample in which the cancellation region 11a was not formed but the dose of ion implantation was instead increased for the formation of the source and drain layers 8, 7.

It is understood from the measurement results of the sample H that in order to abate the adverse effect of the N⁻ impurity region 13b, a mere increase in the implantation dose of the reverse-conductivity-type impurity is not very effective, the implantation needing to be performed at the same implantation angle as that for forming the N⁻ impurity region 13b.

Although in the above-mentioned embodiment, reference has been made to the Pch high withstand voltage transistor, the structure having the cancellation region 11a can be also applied to a structure (hereinafter referred to as "C-DDD structure") such as that disclosed in Published Unexamined Japanese Patent Application No. S 62-217666. Namely, in order to suppress the short-channel effect and hot-carrier effect resulting from the miniaturization of the CMOS type transistor, in the C-DDD structure, a method is devised to simultaneously decrease the both effects by surrounding the source and drain layers of each of the P-type channel MOS transistor (hereinafter referred to as "Pch low withstand voltage transistor") and the N-type channel MOS transistor with a N⁻ impurity region of a higher concentration than that of the well region. Accordingly, in the P-type channel MOS transistor, it is considered that when the driving voltage changes, the threshold value voltage fluctuates, or the current-driving capacity fluctuates, due to the existence of the N⁻ impurity region of higher concentration than that of the well region.

The inventors of the present invention firstly measured the respective threshold value fluctuations of the conventional structure Pch high withstand voltage transistor and Pch low withstand voltage transistor. As a result, the threshold value fluctuation of the Pch high withstand voltage transistor was approximately 0.8V whereas the Pch low withstand voltage transistor was approximately 0.2V, exhibiting a fluctuation width which was not particularly problematic upon operation.

Actually, with the gate electrode width of the high withstand voltage transistor being set to be 2 μm, while the gate electrode width of the low withstand voltage transistor is set to be 1 μm, the low withstand voltage transistor is designed to have a narrower gate-electrode width. Accordingly, it was thought that the shorter channel length low withstand voltage transistor exhibited a wider threshold value fluctuation. However, the result was the reverse, as mentioned above. The inventors of this application considered the reason for this to be as follows.

Namely, in the case of the high withstand voltage transistor, the region which extends under the gate electrode is not the source and drain regions as high-concentration layers but the offset region as low-concentration layers, and therefore it is estimated that the influence of the N⁻ impurity region continues to exist to a large extent. Further, because a high withstand voltage is required to exist, the gate oxide film of the high withstand voltage transistor is formed thicker (in the case of this relevant measurement, this gate oxide film is 1.75 times thicker than the low withstand voltage transistor) than that of the low withstand voltage transistor, and therefore it is also estimated that the threshold value thereof is more liable to fluctuate than that of the low withstand voltage transistor. The inventors of this application thought that, in actuality, these two factors simultaneously affected the relevant values to exhibit the above-mentioned reverse result.

Next, the inventors of this application carried out their experiments while varying the width of the gate electrode in the C-DDD-structural low withstand voltage transistor and as a result confirmed that when the width of the gate electrode decreased down to approximately 1 μm, the fluctuation in the threshold value and the fluctuation in the current-driving capacity became remarkably problematic as in the case of the high withstand voltage transistor. Accordingly, applying the present invention to the C-DDD-structural low withstand voltage transistor as well can also be said to be effective.

Note that in the C-DDD structure to which the present invention has been applied, the cancellation region 11a formed under the gate electrode and in the vicinity of the substrate surface serves to suppress fluctuations in the threshold value voltage and the current-driving capacity, occurring when the drive voltage changes while, on the other hand, the N-type impurity region corresponding to the N⁻ impurity region 11 of the above-mentioned embodiment serves to suppress the occurrence of a punch-through effect due to the short-channel effect.

Further, in the C-DDD structure as well, since the resist mask for forming the cancellation region 11a is the same as the resist mask for forming the source and drain regions, if ion implantation only is added, it would sufficiently serve the purpose.

Namely, while in the method for manufacturing the complementary MOS transistor, in order to obtain a P-type channel MOS transistor enabling suppression of fluctuations in the threshold value voltage and the current-driving capacity, such as that in the case of the above-mentioned embodiment, it suffices to perform ion implantation of the N-type impurity for suppressing the hot-carrier effect of the N-type channel MOS transistor and ion implantation of the N-type impurity for suppressing the short-channel effect of the P-type channel MOS transistor, separately, and by changing the ion implantation angle, this method of ion-implantation performance requires the use of a different resist mask with respect to each ion implantation, so that a photolithographic-step for forming each of the masks must be inconveniently added. Therefore, if the ion implantation 14 is performed as in the case of the above-mentioned embodiment, as regards the Pch high withstand voltage transistor of the above-mentioned embodiment for example, the resist mask that is the same as the one used for forming the offset region 6 can be used. Also, as regards the method for manufacturing the complementary MIS transistor such as that disclosed in Published Unexamined Japanese Patent Application No. S62-217666, the mask for forming the source and drain regions can be used as the resist mask for performing the ion implantation 14. For this reason, it is possible to form the MOS transistor of above-mentioned structure without adding the photolithographic-step for forming the resist mask, as in the case of the above-mentioned manufacturing process.

Further, since in order to obtain the above-mentioned structure capable of suppressing fluctuation in the threshold value voltage and the current-driving capacity, the ion implantation angle for the ion implantation 14 of the N⁻ impurity region 13b of a higher concentration than that of the N⁻ well region 2b and the ion implantation angle for the ion implantation 16 performed in order to form the cancellation region 11a are equalized, it is possible to substantially cancel the regions each of which becomes higher in concentration than the N⁻ well region 2b as a result of diffusion of the N-type impurity, by means of the P-type impurity.

Further, since the impurity doses for the ion implantation 14 and the ion implantation 16 are equalized, the impurity concentration of the cancellation region 11a can be approximated to the impurity concentration of the N⁻ well region 2b.

Although, as described above, explanation has been made using as an example a complementary transistor wherein the Nch low withstand voltage transistor and Pch high withstand voltage transistor are formed in a semiconductor device by use of the manufacturing method of the present invention, the present invention permits various modifications and applications to be made without departing from the spirit and scope of the claimed invention.

Figure 15:
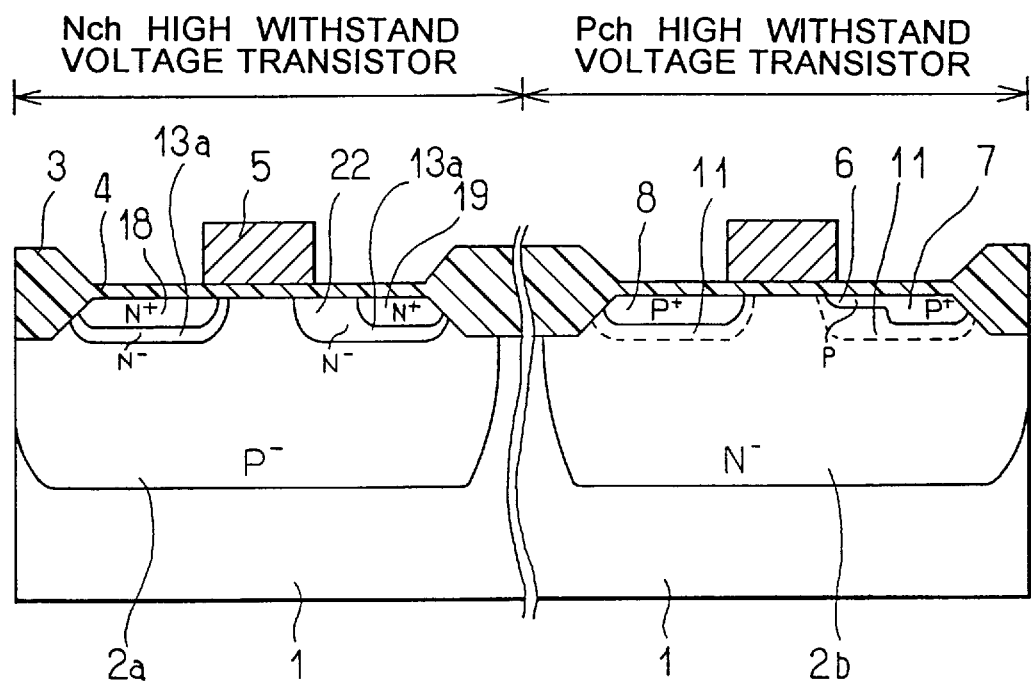
FIG. 15 is a sectional view illustrating another example of the complementary type transistor formed using the manufacturing method of the present invention.
Figure 16:
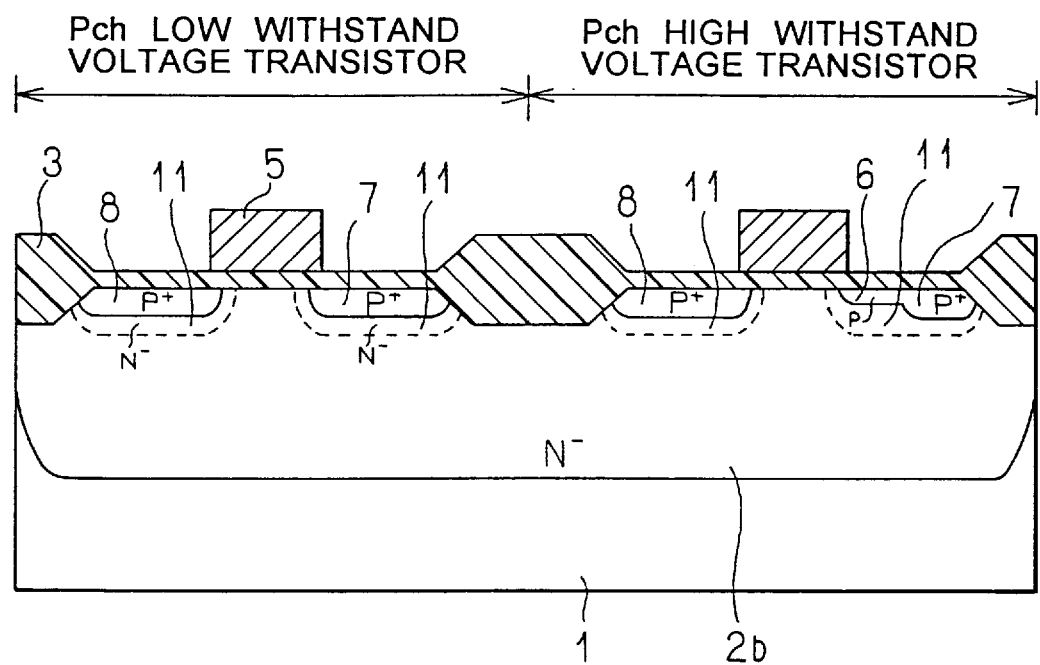
FIG. 16 is a sectional view illustrating an example of a transistor formed using the manufacturing method of the present invention.
Figure 17:
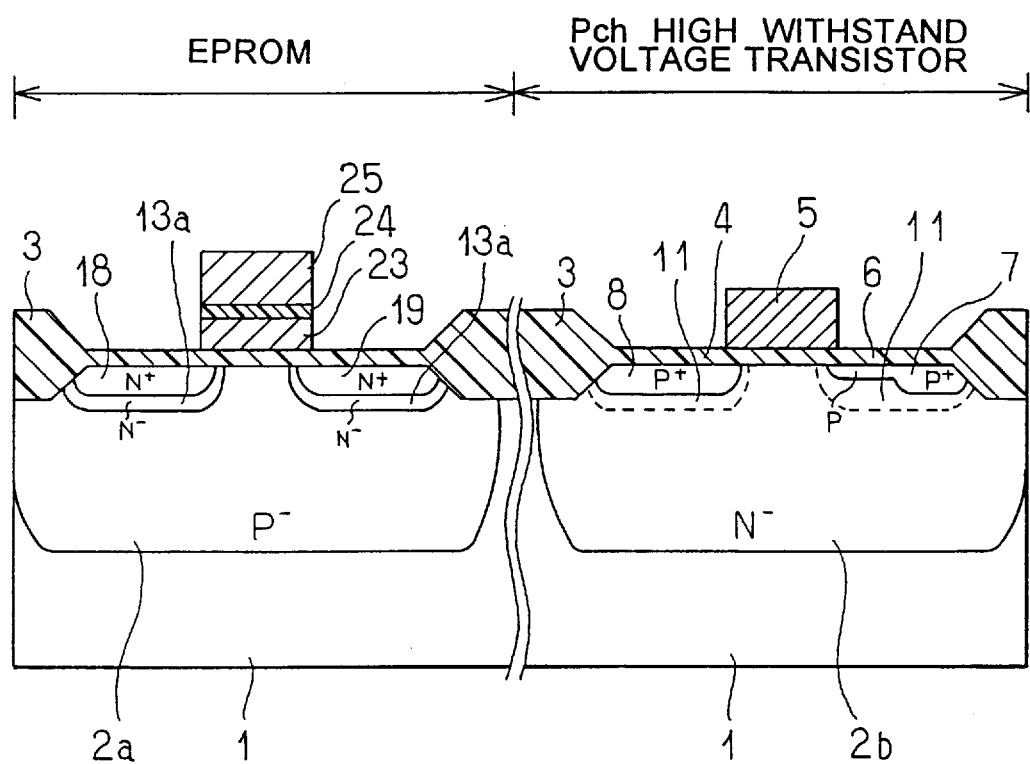
FIG. 17 is a sectional view illustrating another example of a transistor formed using the manufacturing method of the present invention.

FIG. 15 illustrates an example of a complementary transistor wherein an Nch high withstand voltage transistor and a Pch high withstand voltage transistor are formed, FIG. 16 illustrates an example of a complementary transistor wherein a Pch low withstand voltage transistor and a Pch high withstand voltage transistor are formed, and FIG. 17 illustrates an example of a complementary transistor wherein a double-layer gate structure EPROM of a floating gate (23) and a control gate (25) and a Pch high withstand voltage transistor are formed. In order to gain an easier understanding of the manufacturing method therefor, among the components represented by the reference numerals used in these figures, the components which can be formed in the same manufacturing process steps as those explained with reference to FIGS. 7 through 13 (FIG. 14) are denoted by the same reference numerals.

In addition, although in the above explanation has been made in relation to a MOS transistor having an oxide film as an insulator film, the present invention can also be applied to a MIS transistor having different insulator film.

Further, although in the above-mentioned embodiment the first conductivity type and the second conductivity type have been set to be N-type and P-type respectively, it is possible to form in the above-mentioned embodiment a MOS transistor with conductivity types which are the complete reverse thereof, with the first conductivity type and the second conductivity type respectively being set to be a P-type and an N-type.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A MIS type semiconductor device comprising:
    a semiconductor substrate;
    a first semiconductor region of a first conductivity type formed at a surface portion of said semiconductor substrate;
    a source region and a drain region, each of which is of a second conductivity type, being disposed in said first semiconductor region;
    a gate electrode located over a portion of said first semiconductor region intervening between said source and drain regions;
    a second semiconductor region of said first conductivity type disposed in said first semiconductor region to surround said drain region, having an impurity concentration higher than an impurity concentration of said first semiconductor region,
    wherein said second semiconductor region has a portion with an impurity concentration substantially equal to said impurity concentration of said first semiconductor region, said portion being provided where an inversion layer of said MIS type semiconductor device is formed in said second semiconductor region.

2. The MIS type semiconductor device according to claim 1, wherein said portion of said second semiconductor region has an impurity concentration profile substantially equal to an impurity concentration profile of a second portion where said inversion layer is formed in said first semiconductor region.

3. The MIS type semiconductor device according to claim 1, further comprising an offset region of said second conductivity type having an impurity concentration lower than that of the drain region, said offset region being disposed between a gate electrode edge portion and said drain region so as to alleviate a field concentration at a portion of said drain region corresponding to said gate electrode edge portion, wherein said second semiconductor region is formed with a wider area and larger diffusion depth than an area and diffusion depth of said offset region so as to encompass said offset region.

4. The MIS type semiconductor device according to claim 2, further comprising an offset region of said second conductivity type having an impurity concentration lower than that of the drain region, said offset region being disposed between a gate electrode edge portion and said drain region so as to alleviate a field concentration at a portion of said drain region corresponding to said gate electrode edge portion, wherein said second semiconductor region is formed with a wider area and larger diffusion depth than an area and diffusion depth of said offset region so as to encompass said offset region.

5. A MIS type semiconductor device comprising:
a first semiconductor region of a first conductivity type;
a source region and a drain region, each of which is of a second conductivity type, being disposed in said first semiconductor region;
a gate electrode disposed over a surface region of said first semiconductor region between said source and drain regions;
a second semiconductor region of said first conductivity type disposed in said first semiconductor region to be contiguous with said drain region and overlap with a portion between said source and drain regions below said gate electrode, said second semiconductor region having an impurity concentration higher than that of said first semiconductor region; and
a counter-doped region for compensating said portion to have an impurity concentration substantially equal to that of said first semiconductor region.

6. A MIS type semiconductor device according to claim 5, wherein said first conductivity type is N-type and said second conductivity type is P-type.

7. A MIS type semiconductor device comprising:
a first semiconductor region of a first conductivity type;
a source region and a drain region, each of which is of a second conductivity type, being disposed in said first semiconductor region;
a gate electrode disposed over a surface region of said first semiconductor region between said source and drain regions;
a drain extension region of said second conductivity type disposed in said first semiconductor region to be contiguous with said drain region and in a source-to-drain conduction channel, said drain extension region having a lower impurity concentration than said drain region; and
a second semiconductor region of said first conductivity type disposed in said first semiconductor region to be contiguous with said drain region and encompass laterally and vertically said drain extension region, an impurity concentration of said second semiconductor region having a profile such that an impurity concentration at a first region where an inversion layer of said MIS type semiconductor device is created is controlled to be substantially equal to an impurity concentration of said first semiconductor region and that an impurity concentration at a second region which is deeper than said first region is higher than an impurity concentration of said first semiconductor region.

8. A MIS type semiconductor device according to claim 7, wherein said first conductivity type is N-type and said second conductivity type is P-type.

* * * * *